United States Patent
Haug et al.

(10) Patent No.: US 10,442,681 B2
(45) Date of Patent: Oct. 15, 2019

(54) MICROMECHANICAL SYSTEM INCLUDING A SENSITIVE ELEMENT AND ASSOCIATED MANUFACTURING METHOD

(71) Applicant: Robert Bosch GmbH, Stuttgart (DE)

(72) Inventors: Daniel Haug, Neuffen (DE);
Hans-Peter Baer, Pfullingen (DE);
Mike Schwarz, Kusterdingen (DE);
Volkmar Senz, Metzingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/887,567

(22) Filed: Feb. 2, 2018

(65) Prior Publication Data

US 2018/0237290 A1    Aug. 23, 2018

(30) Foreign Application Priority Data

Feb. 17, 2017    (DE) .................. 10 2017 202 605

(51) Int. Cl.
*B81B 3/00* (2006.01)
*B81C 1/00* (2006.01)
*B81B 7/00* (2006.01)

(52) U.S. Cl.
CPC .......... *B81B 3/0072* (2013.01); *B81B 7/0016* (2013.01); *B81C 1/00666* (2013.01); *B81B 2201/0235* (2013.01); *B81B 2203/0127* (2013.01); *B81C 2201/0132* (2013.01); *B81C 2203/0118* (2013.01); *B81C 2203/032* (2013.01)

(58) Field of Classification Search
None
See application file for complete search history.

(56) References Cited

U.S. PATENT DOCUMENTS

| 2014/0306299 | A1* | 10/2014 | Kasai ................... B81B 3/0027 257/416 |
| 2016/0122181 | A1* | 5/2016 | Picco .................... B81B 7/0058 257/419 |
| 2017/0284882 | A1* | 10/2017 | Baldo .................. B81B 3/0021 |

FOREIGN PATENT DOCUMENTS

DE    102015116353 A1    5/2016

* cited by examiner

*Primary Examiner* — Nilufa Rahim
(74) *Attorney, Agent, or Firm* — Norton Rose Fulbright US LLP; Gerard Messina (57) ABSTRACT

A micromechanical system including a sensitive element, the system including a first area in which the sensitive element is situated, and a second area which at least partially surrounds the first area. Furthermore, the system includes a holding element having an elastic property, which joins the first area to the second area, and a joining material, with the aid of which the second area may be joined to a substrate. A spacing area is provided between the first area and the second area. The joining material extends into the spacing area so that a possible movement of the first area caused by the elastic property of the holding element is limited.

15 Claims, 6 Drawing Sheets

# MICROMECHANICAL SYSTEM INCLUDING A SENSITIVE ELEMENT AND ASSOCIATED MANUFACTURING METHOD

CROSS REFERENCE

The present application claims the benefit under 35 U.S.C. § 119 of German Patent Application No. DE 102017202605.7 filed on Feb. 17, 2017, which is expressly incorporated herein by reference in its entirety.

FIELD

The present invention relates to a micromechanical system including a sensitive element and to a method for manufacturing a micromechanical system which includes a sensitive element.

BACKGROUND INFORMATION

Microelectromechanical sensor elements and micromechanical sensor systems including trenches for stress decoupling are available in the related art.

German Patent Application No. DE 10 2015 116 353 A1 describes a micro-integrated sensor having a sensor layer which includes an area provided with a sensitive element. The area provided with the sensitive element is surrounded by an air gap, a circumferentially extending through-trench, and a gap between a surface of the sensor layer and a substrate. Furthermore, the micro-integrated sensor includes elastic joining areas, which extend on an edge area of the area provided with the sensitive element and hold this area.

However, due to the trench process, the MEMS core element becomes sensitive to acceleration and may experience an excitation by different modal forces which may occur according to the possible modes of the component. This circumstance may result in an impairment of the sensor element, and moreover in inaccurate measurement results.

SUMMARY

A micromechanical system including a sensitive element as is provided. Furthermore, a method for manufacturing a micromechanical system which includes a sensitive element is provided.

Preferred refinements of the present invention are described herein.

According to one aspect of the present invention, a micromechanical system including a sensitive element is provided. The micromechanical system includes a first area in which the sensitive element is situated, and a second area which at least partially surrounds the first area. Furthermore, the system includes a holding element having an elastic property, which joins the first area to the second area, and a joining material, with the aid of which the second area may be joined to a substrate. A spacing area is provided between the first area and the second area. The joining material extends into the spacing area in such a way that a possible movement of the first area caused by the elastic property of the holding element is limited.

According to another aspect of the present invention, furthermore a method for manufacturing a micromechanical system is created. The method generally includes the following steps:

providing a wafer including a sensor core area in which a sensitive element is situated;

carrying out a front side trench process so that, laterally of the sensor core area, a front side trench is formed in the wafer, in which a web is situated;

carrying out a rear side trench process so that one or multiple rear side recesses are formed in the wafer;

carrying out an exposure process in which, on an end area of the rear side recesses in the wafer, an exposure of a lower side of the sensor core area is achieved by non-directional etching, and an exposure of the web is achieved for forming an elastic holding element from the web;

providing the wafer with a joining material; and introducing the joining material through the rear side recesses into the exposed area on the lower side of the sensor core area.

Due to the aspects of the present invention, the implementation of a softener/spacer or of a stop in a cloud trench process is made possible. A reduction of transverse influences, such as a reduction of influences of an acceleration of the sensor core area or a reduction of influences of modes on the pressure sensor diaphragm or on the MEMS core element, is advantageously achieved, with the incoupling of mechanical stress on the sensor core area being simultaneously prevented. In this way, in particular an improved process sequence may be implemented, in which an option for integrating a spacer or a stop concept is created.

According to one specific embodiment, the present invention is applied to a sensor in which the second area extends beneath and laterally around the first area. Furthermore, the spacing area may include a first portion beneath the first area, it being possible for the adhesive material to extend into the first portion of the spacing area.

Furthermore, the spacing area may include at least one second portion, which is situated laterally of the first area and extends between a front side of the system and a lower side of the first area. The holding element may be situated in the second portion of the spacing area and surround the first area on its sides.

According to one preferred specific embodiment, the holding element may be formed integrally with a material of the first area and of the second area.

The second area preferably includes through-holes, which are situated beneath the first area and extend between a lower side of the second area and a lower side of the first area and open into the spacing area.

A portion of the joining material may be introduced into the spacing area with the aid of the through-holes. Furthermore, a portion of the joining material may extend through the through-holes into the spacing area.

According to one particular specific embodiment of the present invention, the joining material is formed at least partially from a soft adhesive material, so that the joining material in the spacing area may act as a damping material during a deflection of the first area occurring relative to the second area.

According to another specific embodiment, the joining material may be at least partially formed from a hard adhesive material, so that the joining material in the spacing area may act as a spacer and/or a stop for the first area during a deflection of the first area occurring relative to the second area.

The adhesive material may be cured after introduction in the exposed area, in particular by a temperature step.

Furthermore, the adhesive material may be introduced into the exposed area by utilizing a capillary effect and/or by a contact pressure of the wafer on a substrate and/or by a temperature effect.

According to one preferred specific embodiment of the present invention, the first area includes a diaphragm, which is provided with the sensitive element, and a cavity abutting the diaphragm.

According to one particular specific embodiment of the present invention, the adhesive material is applied as a film to a wafer lower side, the wafer being pressed via the wafer lower side, together with the applied film, onto the substrate.

According to another particular specific embodiment, the adhesive material is applied to the substrate, the wafer being pressed via the wafer lower side onto the substrate provided with the adhesive material.

BRIEF DESCRIPTION OF THE DRAWINGS

Preferred specific embodiments of the present invention are described in greater detail below based on the figures.

DETAILED DESCRIPTION OF EXAMPLE EMBODIMENTS

In the figures, identical reference numerals denote identical or similar components.

Figure 1:
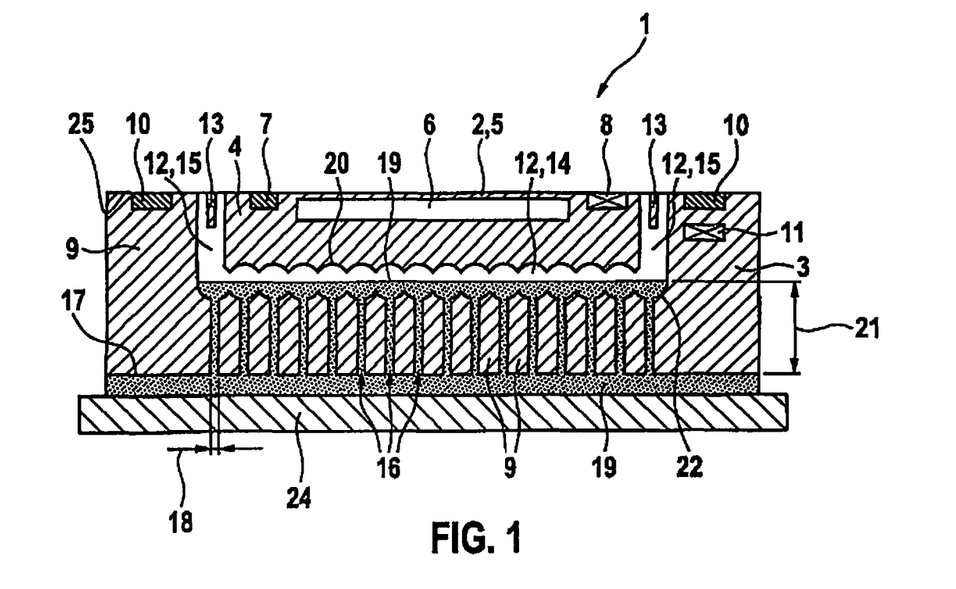
FIG. 1 shows a schematic sectional view of a system including a sensitive element, according to one specific embodiment of the present invention.

FIG. 1 shows a schematic sectional view of a system 1 including a sensitive element 2, according to one specific embodiment of the present invention. System 1 includes a wafer 3, which generally includes one or multiple layers, which in particular may be formed according to a semiconductor processing and which, for example, include one or multiple silicon layers. System 1 is designed as a microelectromechanical system (MEMS). The system includes a first area 4, which acts as a MEMS core element of system 1. The MEMS core element or first area 4 furthermore includes sensitive element 2, which is configured as a diaphragm 5 here, which is provided with a multitude of electrical resistors, the electrical resistors not being explicitly shown here for the sake of simplicity of the illustration. Diaphragm 5 is situated over a cavity 6 which is spanned by diaphragm 5. Furthermore, the MEMS core element or first area 4 is equipped with electrical strip conductors 7, of which one is shown by way of example in FIG. 1, and if necessary with one or multiple electronic components 8, electronic components 8 according to the method being implemented by the structure of wafer 3 and first area 4. System 1 furthermore includes a second area 9, which surrounds first area 4 laterally and from beneath, as shown in FIG. 1. According to the specific embodiment shown here, second area 9 is also provided with electrical strip conductors 10, and if necessary with one or multiple electronic components 11.

System 1, and in particular first area 4 of system 1, may be used as a sensor chip of a sensor system. Alternatively, system 1 may also be configured as a chip of a stand-alone sensor, which is already partially or fully integrated with a circuit for signal processing of the sensor. For this purpose, the signals recorded by MEMS core element 4 may be preprocessed or forwarded with the aid of electronic components 8, 11. There are also specific embodiments which do not include components 8, 11, the signal processing being carried out by a separate chip, which is not shown here and which is connected to system 1. The arrangement of strip conductors 7, 10 and of electronic components 8, 11 indicated in FIG. 1 is to be regarded only by way of example.

System 1, and in particular the MEMS core element according to the particular specific embodiment shown here, is designed as a pressure sensor. For this purpose, system 1 may be provided with a separate fluid supply, which may be configured in a variety of ways. In the simplest case, the fluid, whose pressure is to be determined, is supplied to diaphragm 5 in that the diaphragm is sufficiently spaced apart from other components and housing parts. This may be the case, for example, when system 1 is joined to a carrier wafer by direct assembly in that strip conductors 10 of second area 9 are joined to a carrier wafer by solder balls. The present invention, however, is not limited to such a variant.

As shown in FIG. 1, a spacing area 12 is situated between first area 4 and second area 9 of system 1, so that first area 4 and second area 9 are spaced apart from one another. In this way, mechanical decoupling of areas 4, 9 is achieved. First area 4 is attached to second area 9 by an elastic holding element 13. Spacing area 12 includes a first portion 14, which is situated between first area 4 and second area 9, or more precisely, beneath first area 4. As a result, first area 4 has a degree of freedom of movement by which shocks, for example, or other influences which could affect the measurement of sensitive element 2 or, generally speaking, lateral influences such as acceleration forces, may be absorbed. Furthermore, spacing area 12, as was already mentioned, is used for the mechanical decoupling of the measuring sensitive parts of the system or of first area 4, so that mechanical stresses, such as may occur in particular due to temperature stresses caused by differing coefficients of expansion, are compensated.

As is furthermore shown in FIG. 1, second area 9 is also spaced from first area 4 on its sides. For this purpose, spacing area 12 includes a second portion 15, which is situated on the sides of first area 4 which, as described above, forms the measuring sensitive MEMS core element. First portion 14 and second portion 15 of spacing area 12 are joined to one another and form the entire spacing area 12.

Holding element 13 is situated in spacing area 12, or more precisely in second portion 15 of spacing area 12. Holding element 13 is, as was already mentioned above, shaped in such a way that it has elastic properties. First holding element 13 thus acts as a spring. Furthermore, strip conductors, which are not explicitly shown here, may extend across holding element 13, which electrically connect first area 4 to second area 9. It should be noted that FIG. 1 only shows a cross section of holding element 13, holding element 13 having an elongate design, as viewed from above, so that it surrounds first area 4 along a portion of its lateral circumference. In cross sections of system 1 not shown here, holding element 13 is joined to first area 4 and to second area 9. According to one variant of the specific embodiment shown here, the holding element may furthermore be formed integrally both with first area 4 and with second area 9. Furthermore, holding element 13 may be formed of multiple, mutually separated individual parts so that holding element 13 includes a multitude of holding elements. This is also already indicated in the cross-sectional view according to FIG. 1, in which two separate holding elements 13 are shown.

Second area 9 of the system has through-holes 16. Through-holes 16 extend from a lower side 17 of second area 9 up to spacing area 12 and open into spacing area 12, or more precisely in its first portion 14, which is situated beneath first area 4. The shape of through-holes 16 is generally not limited to a certain cross-sectional shape. According to the specific embodiment shown here, through-holes 16 in particular have the shape of a round column. According to one variant of the specific embodiment, the through-holes may also have the shape of elongate gaps or other cross-sectional shapes. Furthermore, the through-holes, according to a view from beneath, may be situated according to any arbitrary suitable two-dimensional arrangement. According to the specific embodiment shown here, through-holes 16 are situated on lower side 17 of second area 9 in such a way that they, as viewed from beneath, appear as a kind of perforated grating, through-holes 16 in a side view extending vertically up to spacing area 12, 14. Width 18 of through-holes 16 is selected in such a way that a capillary effect may be effectively utilized during the manufacture of the system. In this way, it is made possible that, during the manufacturing process, a suitable joining material 19, an adhesive or an adhesive material 19 here, may be introduced from lower side 17 of second area 9 through through-holes 16 into spacing area 12, 14.

In this way, system 1 includes an adhesive material 19 which is situated on lower side 17 of second area 9 in through-holes 16, and in first portion 14 of spacing area 12, i.e., directly beneath first area 4. Adhesive material 19, depending on the variant, in particular includes a soft adhesive, so that a mechanical damper for MEMS core element 4 mounted on springs 13 is provided. Even though adhesive material 19 in the schematic illustration shown here does not fill the entire height of first portion 14 of spacing area 12, it is conceivable that adhesive material 19 is introduced with a higher or lower filling level than that which is indicated in FIG. 1. For example, it is conceivable that the soft adhesive is used as a damper for first area 4 and completely or at least approximately comes up to lower side 20 of first area 4. Alternatively, adhesive material 19 may also include a hard adhesive, depending on the embodiment. As a result of a suitably selected filling level 21 of the adhesive material, depending on the type of the adhesive material, a desired damping and/or stop property of adhesive material 19 with respect to a possible relative movement of first area 4 with respect to entire system 1 may be set.

Even though upper side 20 and lower side 22 of first portion 14 are shown highly undulated in FIG. 1, the present invention is not limited to such an appearance of spacing area 12, 14. The undulated profile in the schematic representation was primarily selected to illustrate a shape caused by, for example, an isotropic etching process. However, depending on the selected process control, the profile of the spacing area may also be shaped differently, in particular almost smoothly. This may in particular also be controlled by the selection of the type and shape of through-holes 16.

Furthermore, it is also possible not to provide entire lower side 17 of second area 9 with adhesive material 19, but instead apply adhesive material 19 only partially or according to a predetermined structure, using a suitably selected mask. In such a variant, it is also possible that, contrary to the exemplary schematic representation shown in FIG. 1, a predetermined partial number of through-holes 16 serves as a fluid access for the MEMS core element, instead of as a feed channel for joining material 19. In such a variant, the distribution of adhesive material 19 in spacing area 12, 14 is selected in such a way that provided damping and/or stop properties in any case are sufficiently provided.

As is furthermore shown in FIG. 1, second area 9 of system 1 is joined with the aid of adhesive material 19 to a substrate 24, which may be configured as a carrier of system 1. For example, substrate 24 may be a carrier wafer on which, in addition to system 1, a signal processing chip, which is not shown here, and/or a housing is provided. Alternatively, according to one variant of the specific embodiment, substrate 24 may also be used as a rear cover of system 1, the system being joined via front side 25 to a carrier wafer. The electrical contacting of system 1 may in particular also take place with the aid of wire bonding. Alternatively, [it] may also be applied as an ASICap to the front side using bonding.

Figure 2:
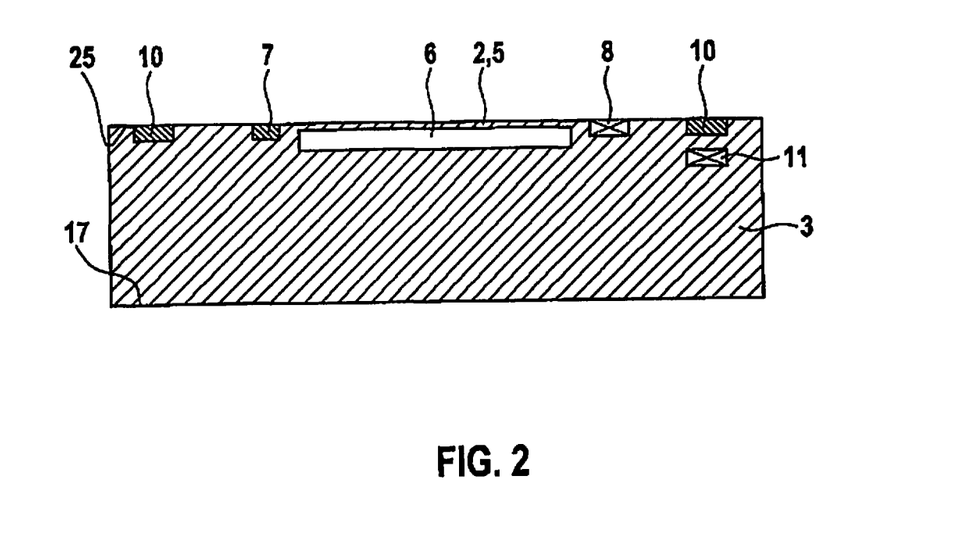
FIG. 2 shows a schematic sectional view of a wafer of the system according to one manufacturing step, according to one specific embodiment of the present invention.

FIG. 2 shows a sectional view through a wafer 3 according to a step for manufacturing system 1, according to one specific embodiment of the present invention. The bulk of wafer 3 is formed of silicon. As shown in FIG. 2, the provided wafer 3 is provided with a sensitive element 2 or a diaphragm 5. Furthermore, wafer 3 is structured in order to form a micromechanical sensor system and for this purpose, in addition to sensitive element 2, includes corresponding strip conductors 7, 10 and electrical components 8, 11.

Figure 3:
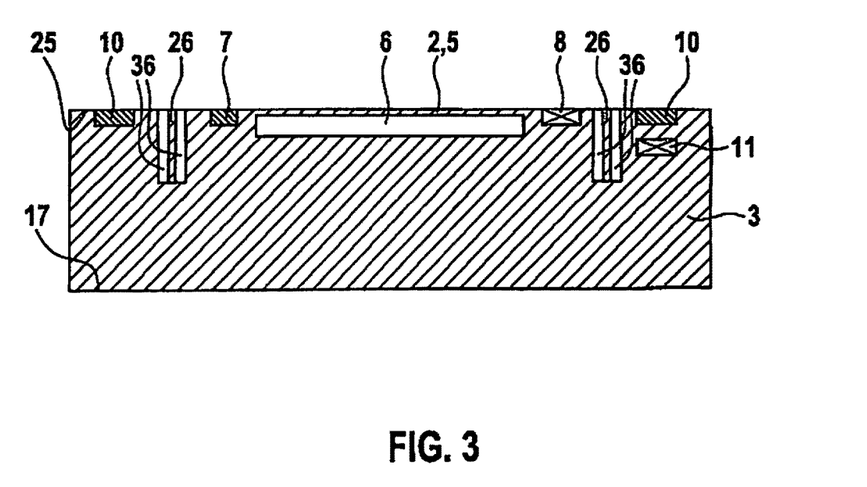
FIG. 3 shows a schematic sectional view of a wafer of the system according to another manufacturing step, according to one specific embodiment of the present invention.

FIG. 3 shows a sectional view through wafer 3 according to a further step for manufacturing system 1. Compared to FIG. 2, wafer 3 was provided with trenches 36 in such a way that webs 26 have formed, as is shown in FIG. 3. Trenches 36 are formed using a front side trench process, for which purpose in particular an anisotropic etching method was used. For example, the trenches may be created with the aid of deep reactive ion etching (DRIE). From webs 26, holding elements 13 are formed in a subsequent step.

Figure 4:
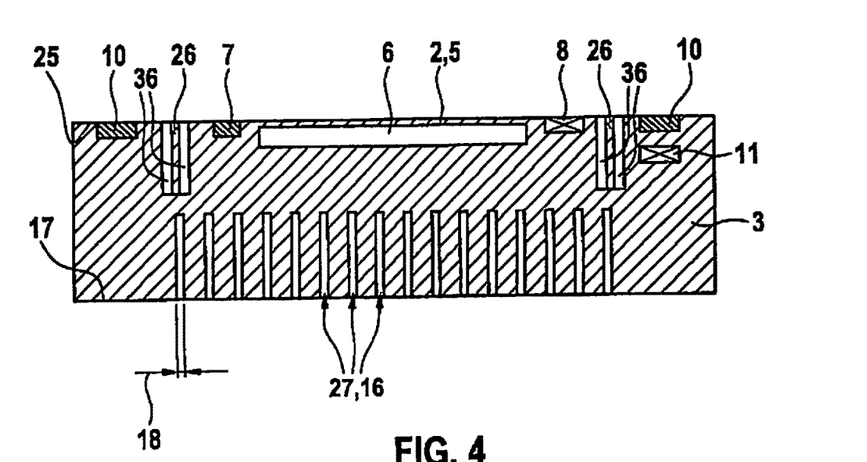
FIG. 4 shows a schematic sectional view of a wafer of the system according to another manufacturing step, according to one specific embodiment of the present invention.

FIG. 4 shows a sectional view through wafer 3 according to a further step for manufacturing system 1. Compared to FIG. 3, wafer 3 is provided with recesses or blind holes 27, which then represent through-holes 16 of system 1. To create blind holes 27, a hole pattern is generated on rear side 17 of the wafer using photolithography and is anisotropically etched. In this way, a rear side trench process is carried out. The etching of blind holes 27 stops in the bulk silicon. According to the specific embodiment shown here, the etching of blind holes 27 may in particular be carried at a point in time at which wafer 3, following a bonding process which is not shown here, has already been joined via upper side 25 to a carrier wafer, which is not shown here.

Figure 5:
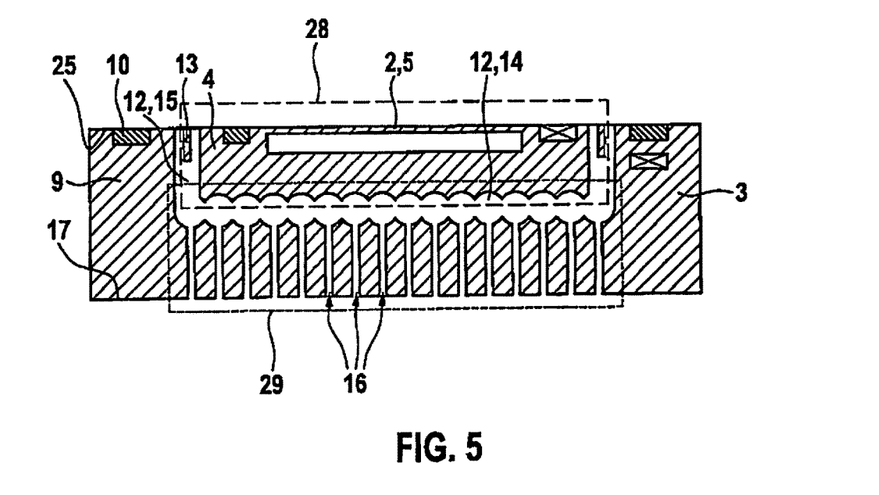
FIG. 5 shows a schematic sectional view of a wafer of the system according to another manufacturing step, according to one specific embodiment of the present invention.

FIG. 5 shows wafer 3 according to a further step for manufacturing system 1. Compared to FIG. 4, wafer 3 is provided with an undercut 14 of MEMS core element 28 or of first area 4. The above-described first portion 14 of spacing area 12 is formed by undercut 14. Undercut 14 may be formed, for example, by deactivating a passivation and sputter portion in a DRIE etching process, so that an undercut, and thus an exposure of springs 13 and of sensor core area 4, 28, is achieved using non-directional further etching at the base of holes 27. This yields a cloud trench 29.

Figure 6:
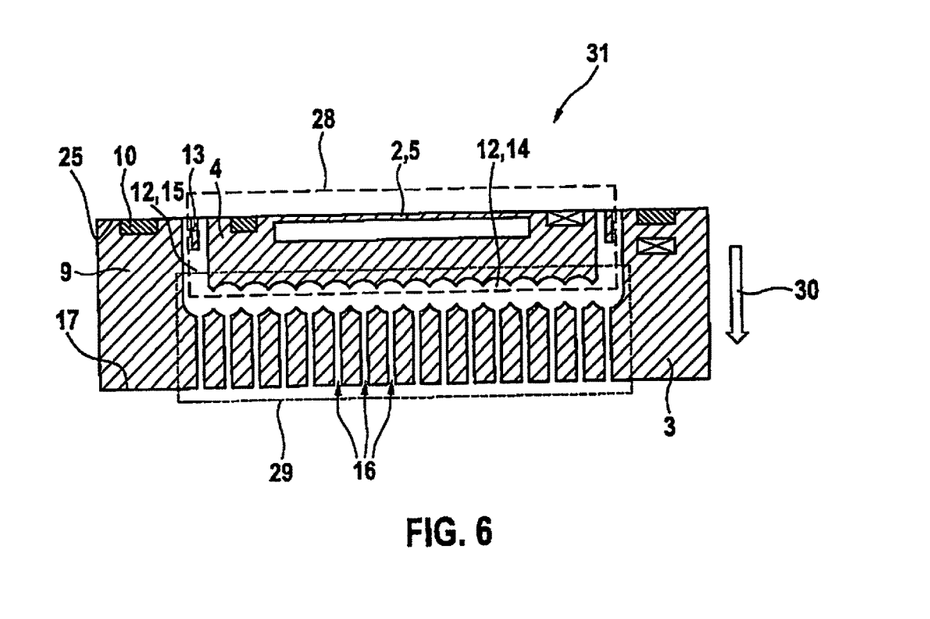
FIG. 6 shows a comparable system, which is not provided with a spacer or a damper implemented by adhesive material.

FIG. 6 shows a comparable system 31, in contrast to system 1 shown in FIG. 1 no spacer or damper implemented by an adhesive material being yet present. During operation of systems 1, 31, a force 30 may act on these, whose exemplary direction is represented in the drawing by an arrow. As is shown, force 30 acts in the direction of the normal of MEMS core area 28 and, due to spacing area 12 and the elastic mounting of core area 4, results in a relative movement or in acceleration lateral influences. In this way, as long as no spacer or damper in the form of adhesive material has been inserted, the function of the sensor may be impaired, and its measurements distorted.

Figure 7:
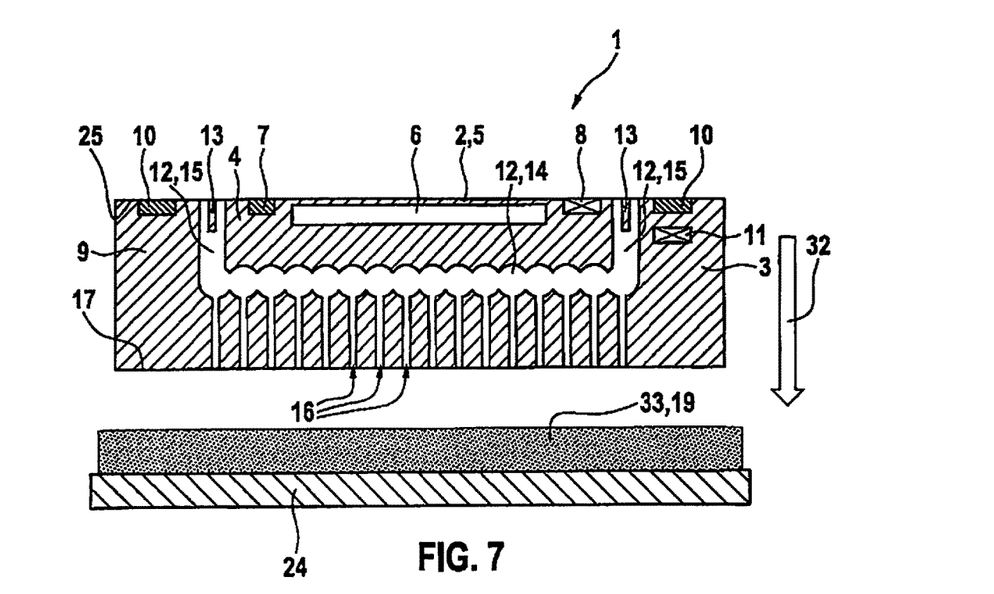
FIG. 7 shows a schematic representation which shows a step of attaching the system to a substrate, according to one specific embodiment of the present invention.

FIG. 7 shows a step of attaching wafer 3 of system 1 to substrate 24, according to one specific embodiment of the present invention. Substrate 24 is provided with a layer 31 of the joining material or adhesive material 19, i.e., with a suitable adhesive. As shown in FIG. 7, wafer 3 is pressed at a certain force 32 onto adhesive layer 31.

Figure 8:
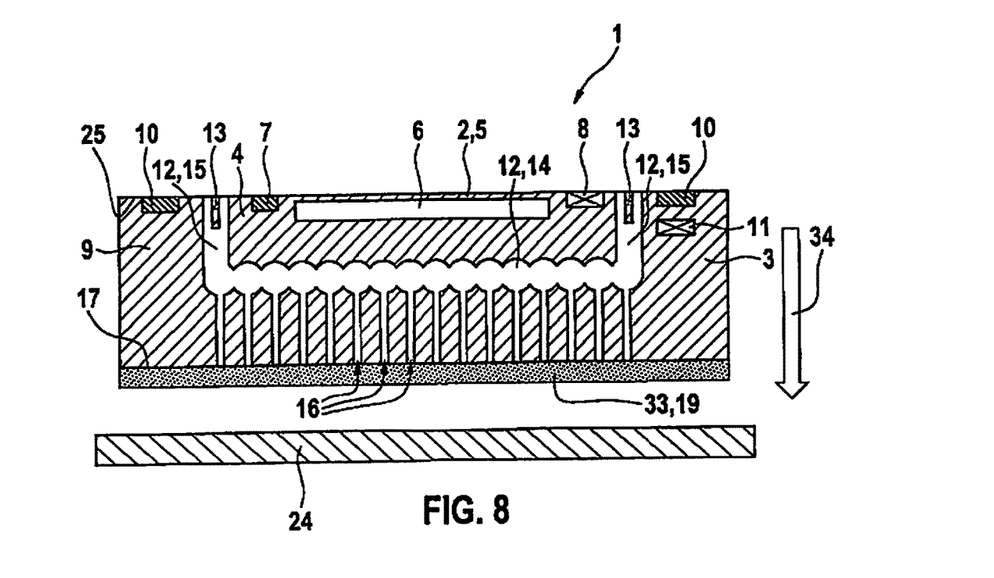
FIG. 8 shows a schematic representation which shows a step of attaching the system to a substrate, according to one specific embodiment of the present invention.

FIG. 8 shows a step of attaching wafer 3 of system 1 according to one specific embodiment of the present invention, an alternative method being shown compared to FIG. 7. As shown in FIG. 8, a layer 33 of a suitable thick film adhesive 19 is used here, which was previously laminated to the rear side of the chip, i.e., to the rear side of wafer 3. Wafer 3 together with layer 33 or DAF (die attach film) 33 is pressed onto substrate 24, which is indicated here by arrow 34.

Figure 9:
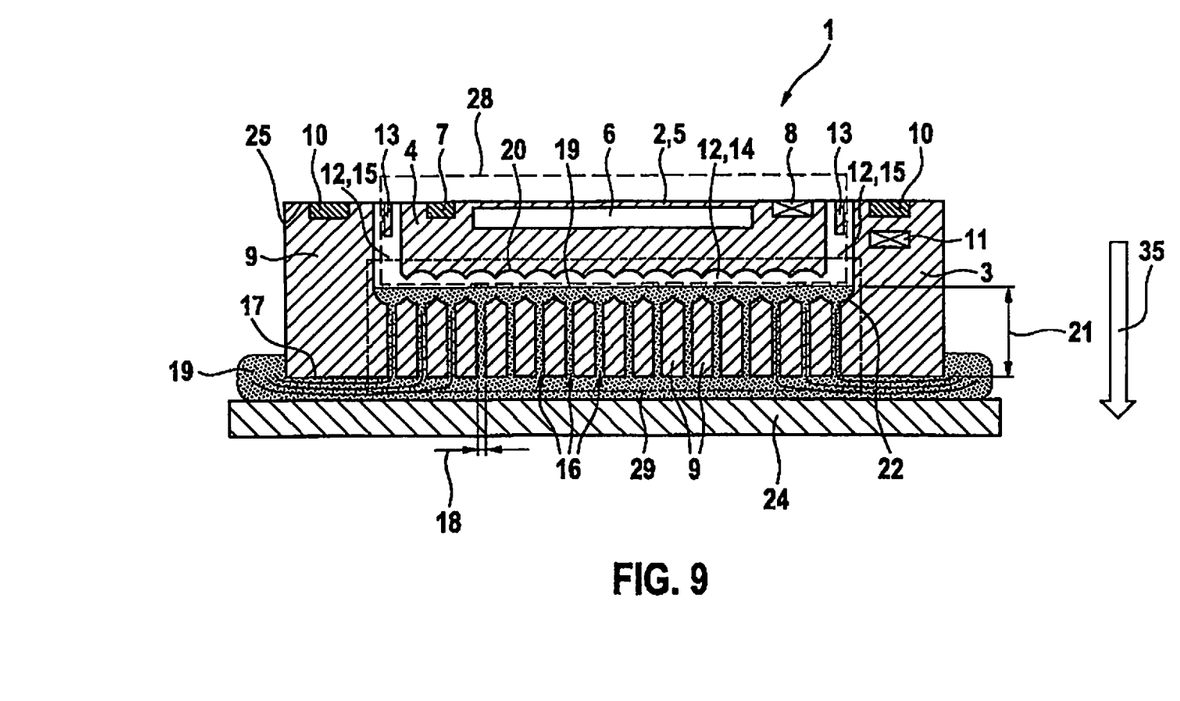
FIG. 9 shows a schematic representation which shows a step of filling the spacing area with an adhesive material, according to one specific embodiment of the present invention.

FIG. 9 shows a step of filling spacing area 12, 14 with adhesive material 19. Contact pressure 35, and if necessary utilizing a predetermined temperature effect, and the capillary effect cause adhesive 19 to rise into the trench openings, i.e., into through-holes 16, as shown in FIG. 9.

With a sufficient amount of a soft adhesive 19, adhesive 19 ultimately reaches isotropic etching chambers 14 of cloud 29 and may thus form a mechanical damper for MEMS core element 4, 28 mounted on springs 13. In this way, the occurrence of hard impacts and the acceleration sensitivity of system 1 may be reduced.

Alternatively, it is also possible to use a suitable amount of hard adhesive, of which according to the method only a thin adhesive layer forms in the isotropic etching chambers of cloud 29. In a subsequent temperature step, the adhesive is cured and thus forms a stop for MEMS core element 4.

Figure 10:
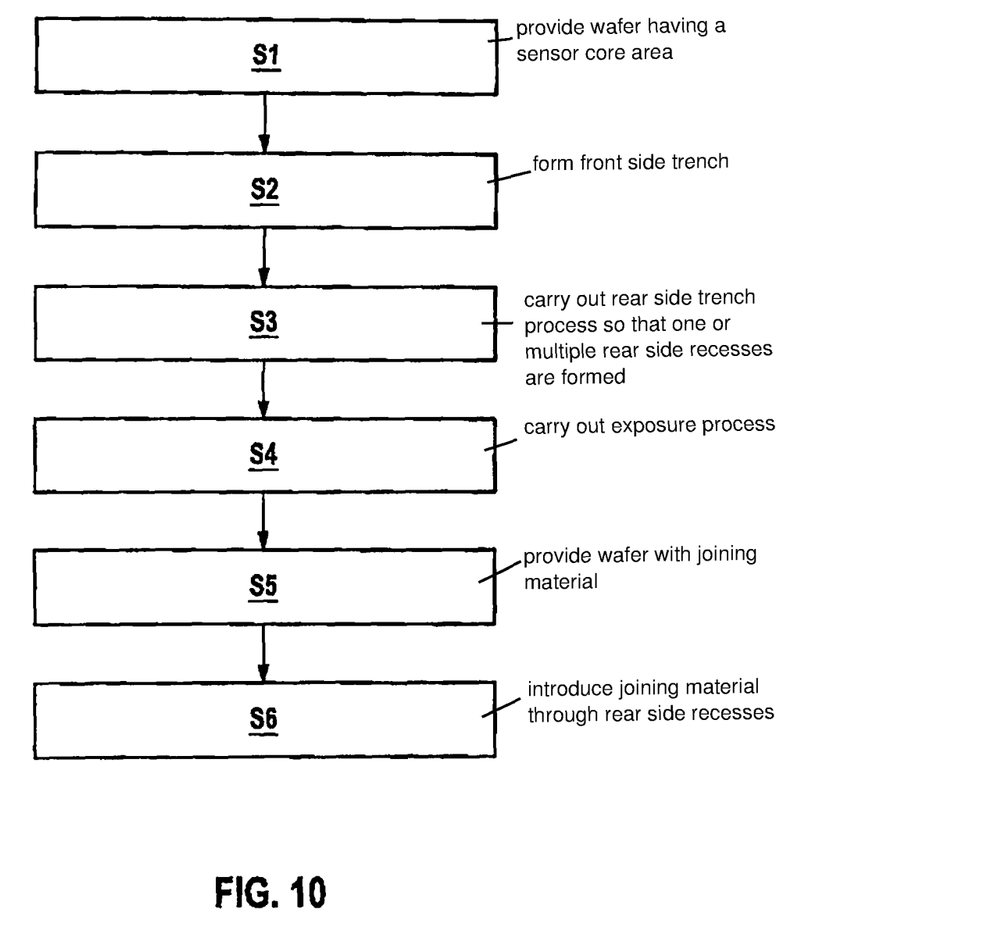
FIG. 10 shows a flow chart of a method for manufacturing a micromechanical system, according to one specific embodiment of the present invention.

FIG. 10 shows a flow chart of a method for manufacturing a micromechanical system, according to one specific embodiment of the present invention. In a step S1, a wafer having a sensor core area is provided, a sensitive element being situated in the sensor core area. In step S2, a front side trench process is carried out on the wafer so that, laterally of the sensor core area, a front side trench is formed in wafer 3, in which a web is situated. Then, in step S3, a rear side trench process is carried out so that one or multiple rear side recesses are formed in the wafer. In step S4, an exposure process is carried out, in which, on an end area of the rear side recesses, an exposure of a lower side of the sensor core area and of the web is achieved in the wafer by non-directional etching. Furthermore, in step S5, the wafer is provided with a joining material, and in step S6 the joining material is introduced through the rear side recesses into the area exposed on the lower side of the sensor core area.

It shall be understood that, depending on the selected specific embodiment, the above-shown steps may be varied. The present invention is primarily directed to the provision of a damper and/or spacer with the aid of a joining material or adhesive material. The detailed steps, in particular for the creation of the MEMS core element and its configuration, may vary as a function of the type of the used sensor. As a result, it shall also be understood that steps not explicitly shown here with respect to the provision of the actual sensor may be carried out. Even though a specific pressure sensor having a pressure sensor diaphragm is described in the specific embodiments shown here, the present invention is generally suitable for arbitrary micro-integrated sensors in which a spacing area in the wafer is present for the mechanical decoupling of a MEMS core element. In particular, the present invention may also be applied to layer systems not explicitly shown here, which according to the present invention are provided with a damper and/or a spacer. For example, the wafer of the system may include an insulating layer, a doping, a sacrificial layer and the like, which for the sake of generality and simplicity of the illustration are not expressly discussed here.

What is claimed is:

1. A micromechanical system provided with a sensitive element, comprising:
   a first area in which the sensitive element is situated;
   a second area that includes a plurality of through-holes and that at least partially surrounds the first area, with a spacing area arranged between the first area and a first side of the second area;
   a holding element that has an elastic property and joins the first area to the second area; and
   a joining material that:
   (a) is an adhesive by which a second side of the second area, which is opposite the first side of the second area, is joinable to a substrate;
   (b) extends from on the second side of the second area, through a region of the second area, and into the spacing area, thereby limiting a possible movement of the first area caused by the elastic property of the holding element; and
   (c) fills a first subset of the through-holes, wherein a second subset of the plurality of through-holes are open passages that fluidically connect the second side of the second area to the spacing area.

2. The micromechanical system as recited in claim 1, wherein the second area extends beneath and laterally around the first area, the spacing area includes a first portion beneath the first area, and the joining material extends into the first portion of the spacing area.

3. The micromechanical system as recited in claim 1, wherein the spacing area includes at least one second portion, which is situated laterally of the first area and extends between a front side of the micromechanical system and a lower side of the first area, and the holding element is situated in the second portion of the spacing area and surrounds the first area on its side.

4. The micromechanical system as recited in claim 1, wherein the holding element is formed integrally with a material of the first area and of the second area.

5. The micromechanical system as recited in claim 1, wherein the plurality of through-holes are situated beneath the first area and extend between the second side of the second area and a lower side of the spacing area.

6. The micromechanical system as recited in claim 5, wherein a portion of the joining material is introduced into the spacing area with the aid of the first subset of the plurality of through-holes.

7. The micromechanical system as recited in claim 5, wherein a portion of the joining material extends through the first subset of the plurality of through-holes into the spacing area.

8. The micromechanical system as recited in claim 1, wherein the joining material is formed at least partially from a soft adhesive material, so that the joining material in the spacing area acts as a damping material during a deflection of the first area occurring relative to the second area.

9. The micromechanical system as recited in claim 1, wherein the joining material is formed at least partially from a hard adhesive material, so that the joining material in the spacing area acts as at least one of a spacer and a stop for the first area during a deflection of the first area occurring relative to the second area.

10. The micromechanical system as recited in claim 1, wherein the first area includes a diaphragm provided with the sensitive element and a cavity abutting the diaphragm.

11. The micromechanical system as recited in claim 1, wherein the sensitive element extends over a cavity in the first area, which is above the region of the second area through which the joining material extends.

12. A method for manufacturing a micromechanical system, comprising:
   providing a wafer including a first area in which a sensitive element is situated;
   carrying out a front side trench process so that, laterally of the first area, a front side trench is formed in the wafer in which a web is situated;
   carrying out a rear side trench process so that multiple rear side recesses are formed in the wafer;
   carrying out an exposure process in which, on an end area of the rear side recesses in the wafer, an exposure of a lower side of the first area and of the web is achieved by non-directional etching, thereby forming a second area that includes a plurality of through-holes formed by the multiple rear side recesses and that at least partially surrounds the first area with a spacing area arranged between the first area and a first side of the second area, and thereby forming, from the web, a holding element that has an elastic property and that joins the first area to the second area; and
   introducing a joining material to fill a first subset of the plurality of through-holes, extending from on a second side of the second area, through a region of the second area, and into the spacing area, thereby limiting a possible movement of the first area caused by the elastic property of the holding element, wherein:
      the joining material is an adhesive by which the second side of the second area, which is opposite the first side of the second area, is joinable to a substrate; and
      a second subset of the plurality of through-holes are open passages that fluidically connect the second side of the second area to the spacing area.

13. The method as recited in claim 12, wherein the joining material is introduced into the spacing area at least one of: (i) by utilizing a capillary effect, (ii) by a contact pressure of the wafer on the substrate, and (iii) by a temperature effect.

14. The method as recited in claim 13, wherein the joining material is applied as a film to a bottom side of the wafer, and the method further comprises pressing the bottom side of the wafer, together with the applied film, onto the substrate.

15. The method as recited in claim 13, wherein the introduction of the joining material includes applying the joining material to the substrate and pressing a bottom side of the wafer onto the joining material on the substrate.

* * * * *